(12) United States Patent
Boersma

(10) Patent No.: US 7,903,826 B2
(45) Date of Patent: Mar. 8, 2011

(54) HEADSET WITH AMBIENT SOUND

(75) Inventor: Johan Boersma, Emmen (NL)

(73) Assignee: Sony Ericsson Mobile Communications AB, Lund (SE)

( * ) Notice: Subject to any disclaimer, the term of this patent is extended or adjusted under 35 U.S.C. 154(b) by 1369 days.

(21) Appl. No.: 11/370,349

(22) Filed: Mar. 8, 2006

(65) Prior Publication Data

US 2007/0223717 A1 Sep. 27, 2007

(51) Int. Cl.
*H03G 3/20* (2006.01)
(52) U.S. Cl. .............................. 381/57; 381/74
(58) Field of Classification Search .................. 381/71.6, 381/74, 72, 317, 309–311, 313, 370, 375, 381/119, 56, 57, 58; 455/569, 575, 550, 455/556, 557; 379/430, 433, 428, 434, 79
See application file for complete search history.

(56) References Cited

U.S. PATENT DOCUMENTS

| | | | | |
|---|---|---|---|---|
| 5,276,740 A * | 1/1994 | Inanaga et al. | ................. | 381/382 |
| 5,448,637 A * | 9/1995 | Yamaguchi et al. | .......... | 379/430 |
| 7,206,429 B1 * | 4/2007 | Vossler | .......... | 381/381 |
| 2002/0037746 A1 * | 3/2002 | Osano | ........................ | 455/557 |
| 2003/0118197 A1 * | 6/2003 | Nagayasu et al. | .............. | 381/74 |

FOREIGN PATENT DOCUMENTS

| | | |
|---|---|---|
| EP | 0 495 653 A1 | 7/1992 |
| EP | 1 191 770 A2 | 3/2002 |
| JP | 56-010793 | 2/1981 |

OTHER PUBLICATIONS

International Search Report for corresponding Application No. PCT/IB2006/002460 mailed Jan. 23, 2007.

* cited by examiner

*Primary Examiner* — Vivian Chin
*Assistant Examiner* — Lun-See Lao
(74) *Attorney, Agent, or Firm* — Renner, Otto, Boisselle & Sklar, LLP

(57) ABSTRACT

A headset that includes an input that receives an audio signal from an electronic equipment, and at least one earpiece having an electro-acoustic speaker for converting electrical signals to audible sound. The headset further includes at least one microphone that receives ambient sound and converts the ambient sound to an ambient sound signal. In addition, the headset includes a processing circuit formed as an integral unit with the input and the at least one earpiece. The processing circuit includes circuitry that combines the audio signal from the electronic equipment with the ambient sound signal from the at least one microphone and provides the combined signals to the at least one earpiece such that the electro-acoustic speaker reproduces the ambient sound in combination with audio from the audio signal.

17 Claims, 5 Drawing Sheets

HEADSET WITH AMBIENT SOUND

TECHNICAL FIELD OF THE INVENTION

The present invention relates generally to electronic equipment, and more particularly to a headset for electronic equipment.

DESCRIPTION OF THE RELATED ART

Electronic equipment such as portable electronic devices have been popular for decades yet continue to increase in popularity. Many modern portable electronic devices are intended or suitable for recording or playback of acoustic and/or video signals. For example, portable CD or DVD players, MPEG players, MP-3 players, etc., provide a vast variety of forms of personal entertainment. Whether audio and/or video entertainment, there are numerous portable electronic devices to satisfy any user's tastes.

Similarly, portable electronic devices in the form of mobile phones, pagers, communicators, e.g., electronic organizers, personal digital assistants (PDAs), smartphones or the like are also becoming increasingly popular. Such devices allow a user to communicate with others, store and manipulate data, create text, etc., many times within the same device.

Depending on the particular application(s), oftentimes a headset is used in combination with the portable electronic device. The headset typically includes one or more loudspeakers formed in respective earpiece housings that are either placed within the ear (in-ear headphones) or over the ear (over-the-ear headphones). A headset allows the user of a mobile phone to engage in hands free discussion, for example. In the case of media players, a headset allows a user to enjoy a private listening experience without bothering others.

Conventional headsets, however, do possess disadvantages. The earpieces alone or in combination with the music or other audio reproduced by the headset can completely block out all other sounds from the environment. Typically, the higher the volume of the audio being reproduced, the less likely that outside environmental sounds will be recognized by the user. While there are times the user may desire isolation of this type, there also are times when the user's inability to hear these ambient sounds can be undesirable or even dangerous. For example, a user wearing a headset while in traffic may be unable to hear police or emergency equipment sirens, thereby creating a potentially dangerous situation. In a social situation, a user wearing a headset still may desire to hear sound from his/her surroundings.

Headsets in the past have attempted to maintain ambient sound in addition to the audio reproduced by the headsets. Such headsets have included headsets with one or more microphones designed to pick up ambient sounds. The ambient sounds are then combined with the audio signal and reproduced by the headsets.

Nevertheless, the aforementioned attempts have fallen short insofar as providing a user with comfortable and convenient reproduction of ambient sound together with the desired audio. For example, conventional headsets have been limited with respect to their ability to be used with a variety of types of electronic equipment. Moreover, conventional headsets have not provided the user with sufficient control as to the combining of the ambient sound with the reproduced audio. Still further, conventional headsets have restricted the user's ability to receive and appreciate the spatial characteristics of the ambient sound.

SUMMARY

In view of the aforementioned shortcomings associated with conventional headsets, there is a strong need in the art for a headset suitable for use with a variety of types of electronic equipment. Additionally, there is a strong need in the art for a headset that provides a user with the ability to control the manner in which the ambient sound is combined with the reproduced audio. Still further, there is a strong need in the art for a headset that preserves the spatial characteristics of the ambient sound.

According to an aspect of the invention, a headset for reproducing audio is provided. The headset includes an input that receives an audio signal from an electronic equipment, and at least one earpiece having an electro-acoustic speaker for converting electrical signals to audible sound. The headset further includes at least one microphone that receives ambient sound and converts the ambient sound to an ambient sound signal. In addition, the headset includes a processing circuit formed as an integral unit with the input and the at least one earpiece. The processing circuit includes circuitry that combines the audio signal from the electronic equipment with the ambient sound signal from the at least one microphone and provides the combined signals to the at least one earpiece such that the electro-acoustic speaker reproduces the ambient sound in combination with audio from the audio signal.

According to a particular aspect, the input includes an electrical connector configured to connect directly to the electronic equipment.

In accordance with another aspect, the electrical connector includes an audio plug type connector.

According to still another aspect, the processing circuitry is coupled to the electrical connector via a first audio cable and to the at least one earpiece via a second audio cable, all of which are part of the integral unit.

In still another aspect, the electronic equipment is a mobile telephone.

Regarding another aspect, the input comprises a low-power wireless interface that communicates with an interface included in the electronic equipment.

According to still another aspect, the low-power wireless interface is a Bluetooth interface.

With yet another aspect, the electronic equipment is a mobile telephone.

Regarding a further aspect, the headset includes a pair of earpieces each including an electro-acoustic speaker for reproducing audio from the audio signal and the ambient sound.

In accordance with another aspect, the headset includes a pair of microphones each included in a respective one of the pair of earpieces.

According to another aspect, the at least one earpiece is an earbud-style earpiece.

In accordance with yet another aspect, the earbud-style earpiece includes the at least one microphone.

In yet another aspect, the earbud-style earpiece is configured to be inserted into an ear of a user with the microphone positioned within a cavity formed by the auricle of the ear.

As for still another aspect, a headset for reproducing audio is again provided. The headset includes an input that receives an audio signal from an electronic equipment, at least one earpiece having an electro-acoustic speaker for converting electrical signals to audible sound, and at least one microphone that receives ambient sound and converts the ambient sound to an ambient sound signal. The headset further includes a processing circuit, the processing circuit including circuitry that combines the audio signal from the electronic equipment with the ambient sound signal from the at least one microphone and provides the combined signals to the at least one earpiece such that the electro-acoustic speaker reproduces the ambient sound in combination with audio from the audio signal. The at least one earpiece includes the at least one microphone, and the earpiece is configured to be inserted into an ear of a user with the microphone positioned within a cavity formed by the auricle of the ear.

According to another aspect, the headset includes a pair of earpieces each including a respective electro-acoustic speaker and corresponding microphone, the respective electro-acoustic speaker reproducing the ambient sound received by the corresponding microphone.

In accordance with still another aspect, the processing circuit includes mixture circuitry adjustable by a user to adjust a ratio by which the processing circuit combines the audio signal and the ambient sound signal.

With still another aspect, the processing circuit includes volume adjust circuitry adjustable by the user to adjust the volume of the combined signals independently of the ratio.

As for still another aspect, the processing circuit includes gain control circuitry that compensates for changes in amplitude of the input signal such that the ratio remains constant.

Regarding another aspect, the processing circuit includes bypass circuitry allowing the input signal to pass to the at least one earpiece substantially without modification.

According to another aspect, the processing circuit is formed as an integral unit with the input and the at least one earpiece.

In accordance with another aspect of the invention, a headset for reproducing audio is provided that includes an input that receives an audio signal from an electronic equipment and at least one earpiece having an electro-acoustic speaker for converting electrical signals to audible sound. The headset also includes at least one microphone that receives ambient sound and converts the ambient sound to an ambient sound signal and a processing circuit. The processing circuit includes circuitry that combines the audio signal from the electronic equipment with the ambient sound signal from the at least one microphone and provides the combined signals to the at least one earpiece such that the electro-acoustic speaker reproduces the ambient sound in combination with audio from the audio signal. The processing circuit also includes mixture circuitry adjustable by a user to adjust a ratio by which the processing circuit combines the audio signal and the ambient sound signal.

According to another aspect, the processing circuit includes volume adjust circuitry adjustable by the user to adjust the volume of the combined signals independently of the ratio.

As for another aspect, the processing circuit includes gain control circuitry that compensates for changes in amplitude of the input signal such that the ratio remains constant.

In accordance with still another aspect, the processing circuit includes bypass circuitry allowing the input signal to pass to the at least one earpiece substantially without modification.

Regarding yet another aspect, the at least one earpiece includes the at least one microphone, and the earpiece is configured to be inserted into an ear of a user with the microphone positioned within a cavity formed by the auricle of the ear.

According to another aspect, the processing circuit is formed as an integral unit with the input and the at least one earpiece.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

It should be emphasized that the term "comprises/comprising" when used in this specification is taken to specify the presence of stated features, integers, steps or components but does not preclude the presence or addition of one or more other features, integers, steps, components or groups thereof.

DETAILED DESCRIPTION OF EMBODIMENTS

Figure 1:
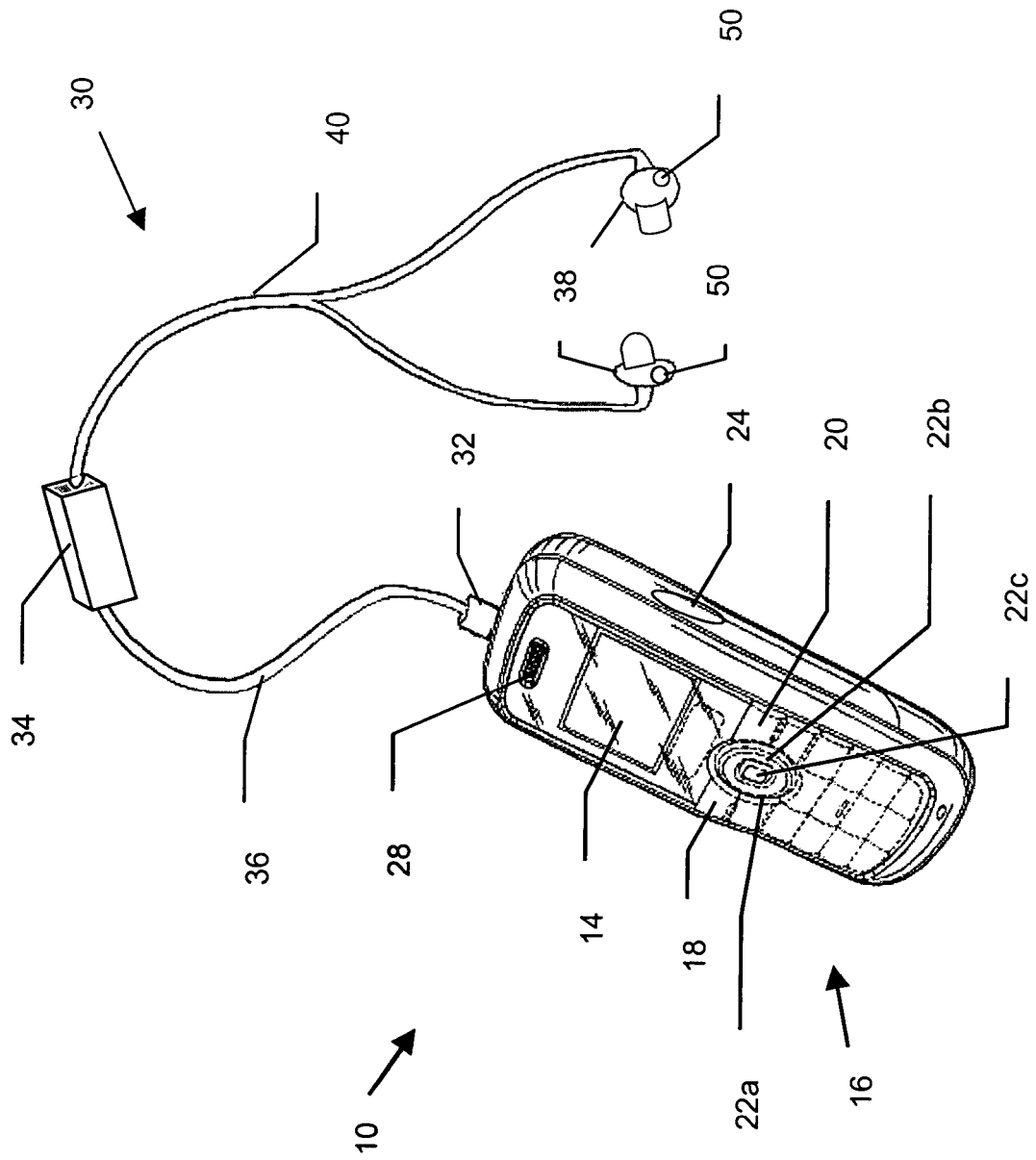
FIG. 1 is an environmental view of a mobile phone and headset in accordance with an embodiment of the present invention.

The present invention will now be described with reference to the drawings, wherein like reference numerals are provided for like elements throughout.

The term "electronic equipment" as referred to herein includes personal portable electronics, including, but not limited to, media players of various formats such as digital music players (e.g., CD, MP3, AC-3, .wma, etc.), video players (e.g., DVD, MPEG, .wmv, etc.), picture players (e.g., JPEG, etc.). Electronic equipment includes traditional media players such as CD and DVD players, as well as the increasingly popular "flash memory" and "hard drive" type media players, referring to the type of memory used to store various media files. Electronic equipment includes dedicated media players as well as multi-functional devices that include media players. Such multi-functional devices include portable radio communication equipment. The term "portable radio communication equipment", also referred to herein as a "mobile radio terminal", includes all equipment such as mobile phones, pagers, communicators, e.g., electronic organizers, personal digital assistants (PDAs), smartphones or the like. In the present application, the invention is described primarily in the context of a mobile phone. However, it will be appreciated that the invention is not intended to be limited to a mobile phone and can be any type of electronic equipment. Moreover, although the invention is described primarily in the context of listening to music via an electronic equipment such as a mobile telephone, it will be appreciated that the invention more generally has application with any type of electronic equipment for which sound is reproduced.

Referring initially to FIG. 1, an electronic equipment 10 is shown in accordance with the present invention. In the exemplary embodiment described herein, the electronic equipment is a mobile phone 10. The mobile phone 10 is shown as having a "brick" or "block" design type housing, but it will be appreciated that other type housings such as clamshell or slide-type housings may be utilized without departing from the scope of the invention.

The mobile phone 10 includes a display 14 and keypad 16. As is conventional, the display 14 displays information to a user such as operating state, time, phone numbers, contact information, various navigational menus, etc., which enable the user to utilize the various features of the mobile phone 10. Similarly, the keypad 16 may be conventional in that it provides for a variety of user input operations. For example, the keypad 16 typically includes alphanumeric keys for allowing entry of alphanumeric information such as telephone numbers, phone lists, contact information, notes, etc. In addition, the keypad 16 typically includes special function keys such as a "call send" key 18 for initiating or answering a call, and a "call end" key 20 for ending, or "hanging up" a call. Special function keys may also include menu navigation keys 22a, 22b and 22c, for example, for navigating through a menu displayed on the display 14 to select different phone functions, profiles, settings, etc., as is conventional. Other keys included in the keypad 16 may include a volume key 24, on/off power key 26, as well as various other keys such as a web browser launch key, camera key, etc.

In the particular embodiment of FIG. 1, the mobile phone 10 includes the display 14 and separate keypad 16. In an alternative embodiment, the display 14 may comprise a touchscreen which itself includes one or more keys. In yet another embodiment, the display 14 may comprise a touchscreen that includes all or substantially all of the keys used to operate the phone 10 so as to include a very limited keypad 16 or no keypad 16 at all. As will be appreciated, the particular form and function of the keys included in the keypad 16 or touchscreen/display 14 are not germane to the invention in its broadest sense.

The mobile phone 10 is a multi-functional device that is capable of carrying out various functions in addition to traditional mobile phone functions. For example, the mobile phone 10 in accordance with the present invention also functions as a media player. More specifically, the mobile phone 10 is capable of playing different types of media objects such as audio files (e.g., MP3, .wma, AC-3), video files (e.g., MPEG, .wmv, etc.), still images (e.g., .pdf, JPEG, .bmp, etc.). The media objects are typically stored in non-volatile memory within the mobile phone 10. The mobile phone 10 reproduces audio files through a speaker 28 or an accessory such as a stereo headset 30 in accordance with the present invention. The stereo headset 30 may be plugged into or otherwise connected to an audio output of the mobile phone 10 via an appropriate connector.

For reasons that will be explained more fully below, the headset 30 overcomes the aforementioned shortcomings associated with conventional headsets used with electronic equipment having an audio output. For example, the headset 30 is suitable for use with a variety of types of electronic equipment. The headset 30 does not necessarily rely on processing circuitry and/or controls within the electronic equipment 10 to provide a user with the ability to listen to reproduced audio yet still be able to hear ambient sound. Moreover, the headset 30 provides a user with the ability to control the manner in which the ambient sound is combined with the reproduced audio. The user has the ability to control the respective levels of the reproduced audio and ambient sound, thereby allowing the user to adjust the listening experience to his or her preference. Still further, the headset 30 preserves the spatial characteristics of the ambient sound. As a result, the user continues to be able to derive aspects such as the direction from which the ambient sound originates. These features increase the safety and improve the listening experience of the user compared to conventional headsets.

The headset 30 in the exemplary embodiment includes an input 32 for receiving an audio signal from the mobile phone 10. The input 32 may include a conventional audio jack/plug or any other type of suitable electrical connector. Preferably the audio signal is a stereo signal including audio for left and right channels, although one will appreciate that the audio signal may be a signal other than stereo (e.g., mono, multi-channel, etc.).

The headset 30 further includes a processor 34 that receives the audio signal from the input 32 via an audio cable 36. In addition, the headset 30 includes a pair of earpieces 38 coupled to the processor 34 via an audio cable 40. Each of the earpieces 38 is conventional in that the earpieces 38 each include an electro-acoustic loudspeaker (not shown) within the earpiece housing for converting electrical signals into audio sound. The processor 34 provides the left and right channel stereo signals from the output of the mobile phone 10 to the respective earpieces 38.

Figure 2:
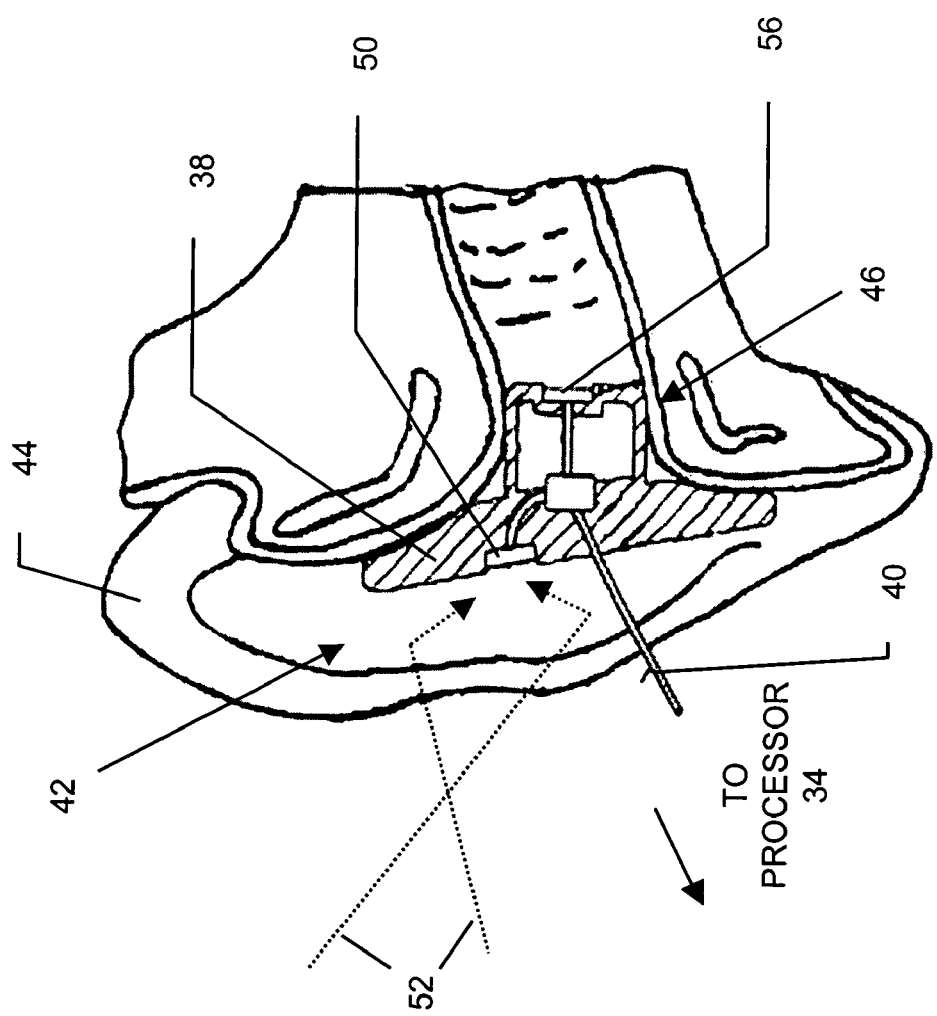
FIG. 2 is a cross-sectional view of an earbud including a microphone positioned so as to be located within the cavity of the auricle in accordance with an embodiment of the present invention.

In the exemplary embodiment, the earpieces 38 are each "in-the-ear" type earpieces such as an earbud 38 as is shown in FIG. 2. As referred to herein, an "in-the-ear" type earpiece 38 is a type that a user wears generally within the cavity 42 formed by the auricle 44 of the ear. Earbuds 38 fit snuggly within the cavity 42 and/or the opening 46 to the ear canal. In contrast, an "outside-the-ear" type earpiece is an earpiece that a user wears generally outside or on top of the cavity 42 formed by the auricle 44.

Continuing to refer to FIGS. 1 and 2, each earpiece 38 includes a microphone 50 for picking up ambient sound. The microphone 50 is positioned within the earpiece housing such that when the earpiece 38 is worn by the user, the microphone 50 is located within and exposed to the cavity 42 formed by the auricle 44. Thus, as represented by arrows 52 in FIG. 2, ambient sound waves collected by the auricle 44 are focused generally towards the microphone 50. As a result, the microphone 50 picks up ambient sound while preserving the spatial characteristics of the sound. That is to say, the same way a human is able to detect the direction from which sounds originate based on the spacing and direction of the ears, the microphones 50 pick up the same ambient sound. In contrast, microphones located in over-the-ear type earpieces lose such spatial characteristics. While the microphones continue to remain spaced apart, the characteristics associated with the direction of the ears is lost due to not being placed within the cavity formed by the auricle 44.

FIG. 2 further illustrates how each earpiece 38 includes an aforementioned loudspeaker 56. The loudspeaker 56 can be of any conventional type (e.g., piezoelectric element, etc.). As is shown in FIG. 2, the loudspeaker 56 receives audio signals from the processor 34 via the audio cable 40. Conversely, the microphone 50 receives the ambient sound and converts such sound into an ambient sound signal that is provided to the processor 34 via the audio cable 40.

As will be explained in more detail below with respect to FIGS. 3 and 4, the processor 34 functions to combine the audio signal received from the mobile phone 10 with the ambient sound signal provided by the respective microphones 50. The processor 34 then provides the combined signals to the loudspeaker 56 in each earpiece 38. In such manner, each earpiece 38 is capable of reproducing the audio signal from the mobile phone 10 together with the ambient sound picked up by the corresponding microphone 50. The spatial characteristics of the ambient sound are therefore preserved.

Referring again briefly to FIG. 1, the headset 30 in the preferred embodiment is an integral, or self-contained unit. Specifically, the input 32, processor 34 and earpieces 38 are fixedly connected to one another via audio cables 36, 40. Thus, the headset 30 represents a self-contained accessory that is not necessarily dependent upon a particular electronic equipment or any other accessory and/or attachment. The headset 30 includes its own processor 34 that obtains the ambient sound and combines the ambient sound with the audio from the electronic equipment to provide the desired listening experience.

Figure 3:
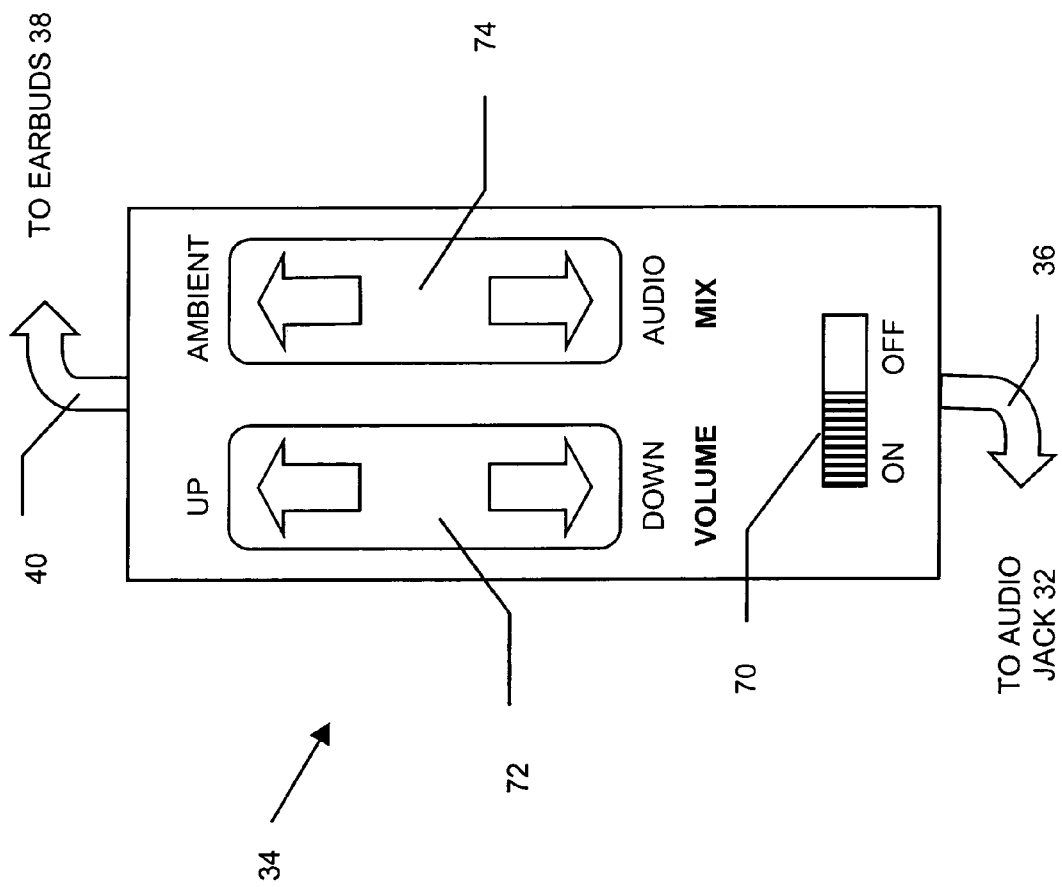
FIG. 3 is front view of a processor of a headset in accordance with an embodiment of the present invention.

Turning to FIG. 3, shown is an exemplary embodiment of the processor 30. As will be explained in more detail below with respect to FIG. 4, the processor 30 includes an on/off switch 70 that allows the user to turn the processor 34 on and off. In the on position, the headset 30 functions to pick up the ambient sound and combine the ambient sound with the audio signal from the mobile telephone 10 so that both may be heard by the user. In the off position, the processor 34 essentially routes the audio signal from the mobile telephone directly to the earpieces 58 as in a conventional headset. The on/off switch 70 is shown as a slide switch, but it will be appreciated that virtually any type of suitable switch may be utilized without departing from the scope of the invention.

The processor 34 also includes a volume control switch 72 and mix switch 74. The volume control switch 72 allows the user to control the volume of the audio reproduced by the headset 30 directly without having to adjust the output volume of the mobile phone 10. The mix switch 74 allows the user to adjust a ratio by which the processor 34 combines the audio signal from the mobile telephone 10 and the ambient sound signal from the microphones 50. By controlling the mix, the user can choose whether the earpieces 38 provide more or less of the ambient sound in relation to the audio signal. Depending on the situation, the user may choose to block most or all of the environmental sounds (e.g., in a crowded train) by substantially reducing the amount of ambient sound provided to the loudspeakers 56. The user may choose to retain the ambient sound at a lower level in situations where it is desirable to maintain some contact with the environment, albeit at a reduced level (e.g., while in traffic). Still further, the user may choose to retain the ambient sound at a higher level under circumstances where it is desirable to retain complete contact with the environment (e.g., in one's living room).

The switches 72 and 74 as shown in FIG. 3 are membrane switches that serve to adjust the volume and mix up or down as a function of the particular arrow that is pressed. However, those having ordinary skill in the art will readily appreciate that virtually any other type suitable switch could also be used without departing from the scope of the invention. For example, switch 72 and/or switch 74 could be replaced with a rotary switch, slide switch, etc. As will also be appreciated, the switches 72 and/or 74 together with any or all of the circuitry described herein may be analog circuitry, digital circuitry, or any combination thereof. While the invention is described herein primarily in the context of an analog design, it will be readily appreciated that the circuitry could alternately be implemented via digital design or a combination thereof.

Figure 4:
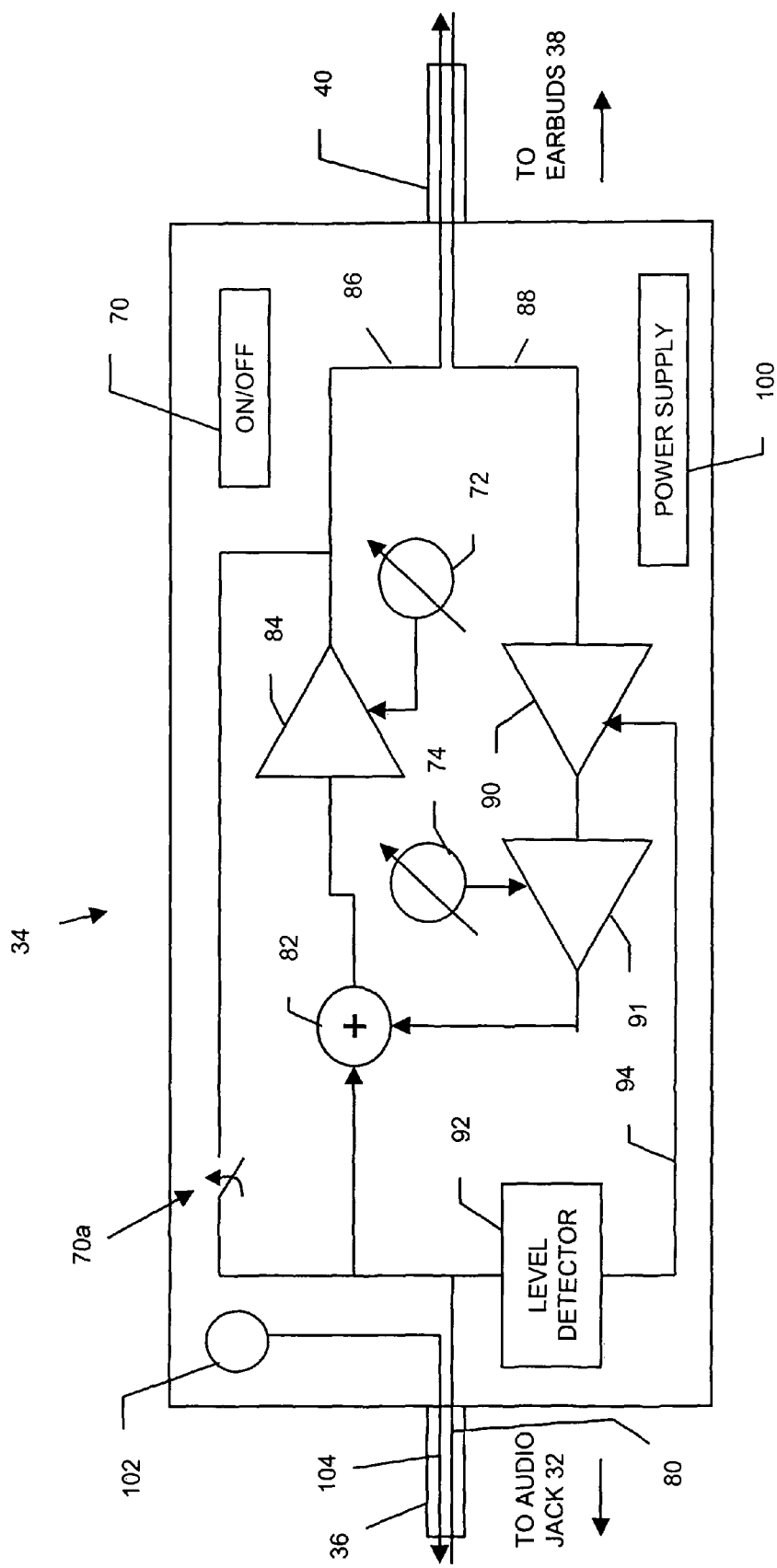
FIG. 4 is a simplified circuit diagram of the processor of FIG. 3 in accordance with an embodiment of the present invention.

FIG. 4 is a schematic illustration of the processor 34. The processor 34 is simplified so as to represent a single channel. Those having ordinary skill in the art, however, will appreciate that a stereo embodiment for handling left and right channel stereo signals provided to respective earpieces 38 involves simply a duplication of the circuit shown in FIG. 4.

The mobile phone 10 provides an audio signal to the processor 34 via line 80 within the audio cable 36. The audio signal on line 36 is input to an adder 82 included in the processor 34. The output of the adder 82 is input to an adjustable gain amplifier 84 that amplifies the output of the adder 82. The output of the amplifier is provided to the earpieces 38 via line 86 within the audio cable 40.

Ambient sound picked up by the microphones 50 is input to the processor 34 as an ambient sound signal on line 88 from the audio cable 40. The ambient sound signal on line 88 is input to an adjustable gain amplifier 90 so as to amplify the ambient sound signal. The amplifier 90 outputs the ambient sound signal into an adjustable gain amplifier 91 whose gain is controlled using a level control switch in the form of the aforementioned mix switch 74. The mix switch 74, in this embodiment preferably a rheostat, controls the level of the amplified ambient sound signal from the amplifier 91 that is provided to another input of the adder 82.

Accordingly, the adder 82 functions to combine the ambient sound signal with the audio signal from the mobile phone 10. By way of adjusting the mix switch 74, the user can control the relative amplitude or ratio of the ambient sound signal to the audio signal as represented by the output of the adder 82. Therefore, the user can control the degree to which the ambient sound is represented in comparison to the audio signal.

The volume switch 72, also preferably a rheostat in this embodiment, functions to adjust the gain of the amplifier 84. Accordingly, the user may control the gain of the amplifier 84 which amplifies the combined audio and ambient sound signals. As a result, the user may control the overall volume of the sound reproduced by the headset.

In a preferred embodiment, the processor 34 may further includes an optional level detector circuit 92 that serves to detect the level of the audio signal received on line 80 from the mobile phone 10. The level detector circuit 92 is designed to output a gain control signal on line 94 that is proportional to the level of the audio signal on line 80. The gain control signal on line 94 serves to adjust the gain of the adjustable gain amplifier 90. As a result, the processor 34 automatically adjusts the level of the ambient sound signal in proportion to changes in the level of the received audio signal. In this manner, even if the user adjusts the audio output volume of the mobile phone 10 or other electronic equipment, the mix ratio of the audio signal and the ambient sound signal will remain substantially constant. Although not shown, the level detector 92 preferably includes a low-pass filter for smoothing the response of the amplifier 90 (e.g., to avoid sudden changes in the level of the ambient sound due to sudden quiet/loud periods in the audio signal).

The processor 34 includes the aforementioned switch 70 which serves to turn power from a power supply 100 on and off to the remaining circuitry. The power supply 100 preferably is self contained, such as a battery. Alternatively, the processor 34 may be designed to receive power from the electronic equipment itself. The switch 70 also may include as a part thereof an optional switch 70a. The switch 70a is normally open during operation (switch 70 is on) so as to remain effectively an open circuit. When the switch 70 is off, switch 70a becomes closed. As a result, the audio signal on line 80 bypasses the circuitry within the processor 34 and is output directly to the earpieces 38 on line 86.

Still further, the processor 34 may include a microphone 102 for picking up the voice of the user during hands-free communication with the mobile phone 10 using the headset 30. The microphone 102 provides a voice signal to the mobile phone 10 via line 104 using conventional techniques.

Figure 5:
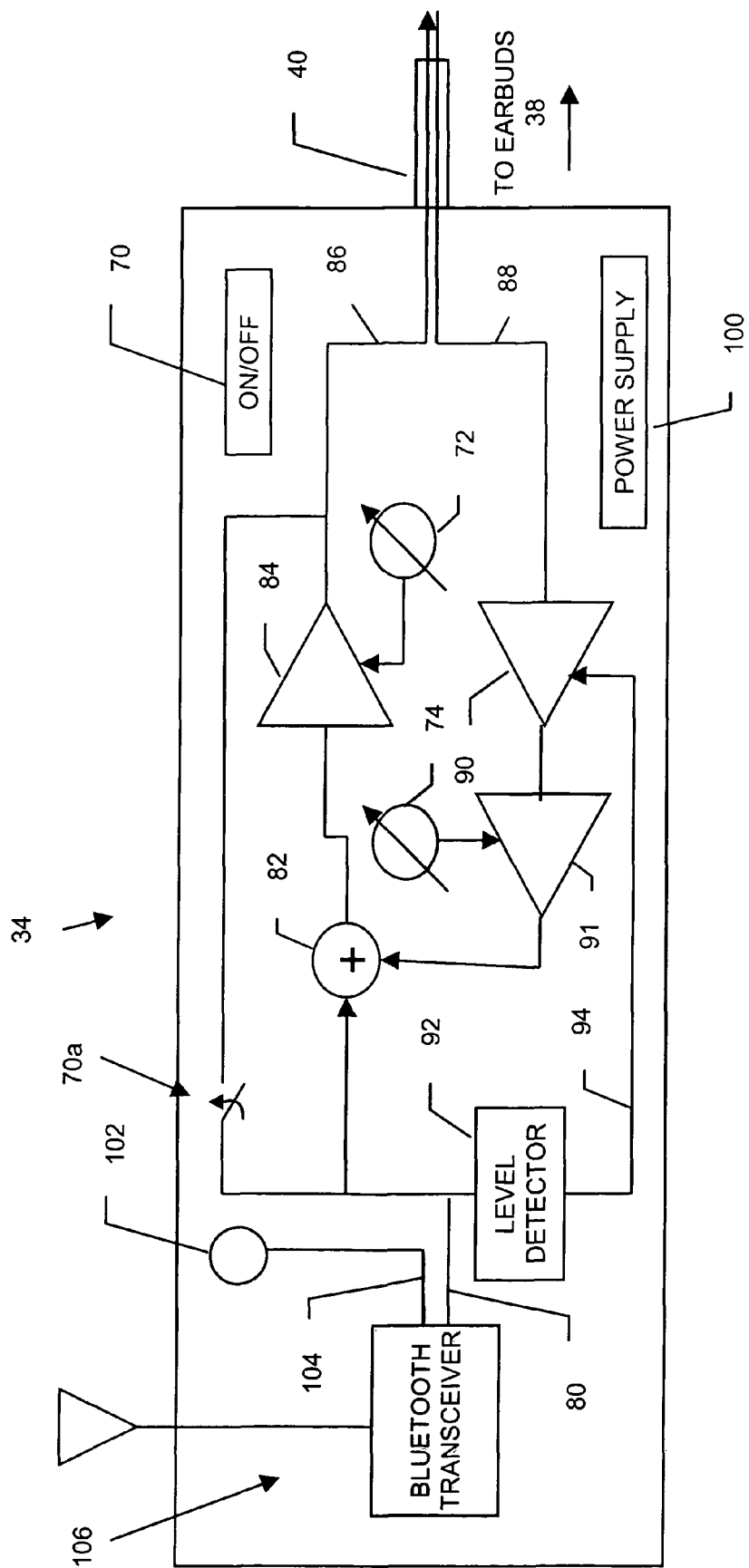
FIG. 5 is a simplified circuit diagram of a processor in accordance with another embodiment of the present invention.

FIG. 5 illustrates an alternative embodiment of the processor 34. In this embodiment, the input 32 is replaced by a low-power wireless interface such as a Bluetooth transceiver 106. The Bluetooth transceiver 106 can be programmed to carry out conventional communications between the headset 30 and the similarly equipped mobile phone 10 or other electronic equipment. In such embodiment, there is no need for an audio cable 36.

Furthermore, the embodiments described herein can be modified without departing from the scope of the invention. For example, while the processor 34 is shown as being part of a housing connected in-line between the earpieces 38 and the input 32, the processor 34 may instead be housed within part of the jack forming the input 32 and/or within the housing of the earpiece(s) 38. Alternatively, in a Bluetooth embodiment the processor 34 may be incorporated within a small housing designed to fit behind the ear of the user similar to known Bluetooth headsets.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

The invention claimed is:

1. A headset for reproducing audio, comprising:
an input that receives an audio signal from an electronic equipment;
at least one earpiece having an electro-acoustic speaker for converting electrical signals to audible sound;
at least one microphone that receives ambient sound and converts the ambient sound to an ambient sound signal; and
a processing circuit formed as an integral unit with the input and the at least one earpiece, the processing circuit including circuitry that combines the audio signal from the electronic equipment with the ambient sound signal from the at least one microphone and provides the combined signals to the at least one earpiece such that the electro-acoustic speaker reproduces the ambient sound in combination with audio from the audio signal, wherein the processing circuit comprises mixture circuitry adjustable by a user to adjust a ratio by which the processing circuit combines the audio signal and the ambient sound signal, and the processing circuit comprises gain control circuitry that compensates for changes in amplitude of the input signal such that the ratio remains constant, and
wherein the at least one earpiece includes the at least one microphone, and the earpiece is configured to be inserted into an ear of a user with the microphone positioned within a cavity formed by the auricle of the ear.

2. The headset of claim 1, wherein the input comprises an electrical connector configured to connect directly to the electronic equipment.

3. The headset of claim 2, wherein the electrical connector comprises an audio plug type connector.

4. The headset of claim 2, wherein the processing circuitry is coupled to the electrical connector via a first audio cable and to the at least one earpiece via a second audio cable, all of which are part of the integral unit.

5. The headset of claim 2, wherein the electronic equipment is a mobile telephone.

6. The headset of claim 1, wherein the input comprises a low-power wireless interface that communicates with an interface included in the electronic equipment.

7. The headset of claim 6, wherein the low-power wireless interface is a Bluetooth interface.

8. The headset of claim 6, wherein the electronic equipment is a mobile telephone.

9. The headset of claim 1, wherein the headset comprises a pair of earpieces each including an electro-acoustic speaker for reproducing audio from the audio signal and the ambient sound.

10. The headset of claim 9, wherein the headset comprises a pair of microphones each included in a respective one of the pair of earpieces.

11. The headset of claim 1, wherein the at least one earpiece is an earbud-style earpiece.

12. The headset of claim 1, further comprising a level detector circuit to detect the level of the audio signal received from the electronic equipment and output a gain control signal to adjust the level of the ambient sound signal in proportion to changes in the level of the received audio signal.

13. A headset for reproducing audio, comprising:
an input that receives an audio signal from an electronic equipment;
at least one earpiece having an electro-acoustic speaker for converting electrical signals to audible sound;
at least one microphone that receives ambient sound and converts the ambient sound to an ambient sound signal; and
a processing circuit, the processing circuit including circuitry that combines the audio signal from the electronic equipment with the ambient sound signal from the at least one microphone and provides the combined signals to the at least one earpiece such that the electro-acoustic speaker reproduces the ambient sound in combination with audio from the audio signal, wherein the processing circuit comprises mixture circuitry adjustable by a user to adjust a ratio by which the processing circuit combines the audio signal and the ambient sound signal, and the processing circuit comprises gain control circuitry that compensates for changes in amplitude of the input signal such that the ratio remains constant, and
wherein the at least one earpiece includes the at least one microphone, and the earpiece is configured to be inserted into an ear of a user with the microphone positioned within a cavity formed by the auricle of the ear.

14. The headset of claim 13, wherein the headset comprises a pair of earpieces each including a respective electro-acoustic speaker and corresponding microphone, the respective electro-acoustic speaker reproducing the ambient sound received by the corresponding microphone.

15. The headset of claim 13, wherein the processing circuit comprises bypass circuitry allowing the input signal to pass to the at least one earpiece substantially without modification.

16. The headset of claim 13, wherein the processing circuit is formed as an integral unit with the input and the at least one earpiece.

17. The headset of claim 13, further comprising a level detector circuit to detect the level of the audio signal received from the electronic equipment and output a gain control signal to adjust the level of the ambient sound signal in proportion to changes in the level of the received audio signal.

* * * * *